United States Patent
Miyagawa (10) Patent No.: US 11,982,717 B2
(45) Date of Patent: May 14, 2024

(54) ACTUATOR CONTROL DEVICE

(71) Applicant: DENSO CORPORATION, Kariya (JP)

(72) Inventor: Sana Miyagawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 38 days.

(21) Appl. No.: 17/841,197

(22) Filed: Jun. 15, 2022

(65) Prior Publication Data

US 2022/0404422 A1 Dec. 22, 2022

(30) Foreign Application Priority Data

Jun. 17, 2021 (JP) ................. 2021-100885

(51) Int. Cl.
*G01R 31/3835* (2019.01)
*H02J 7/00* (2006.01)
*H02P 3/06* (2006.01)
*G05B 19/042* (2006.01)

(52) U.S. Cl.
CPC .... *G01R 31/3835* (2019.01); *H02J 7/007182* (2020.01); *H02P 3/06* (2013.01); *G05B 19/0423* (2013.01)

(58) Field of Classification Search
CPC .. G01R 31/00; G01R 31/3835; G01R 19/165; G05B 19/00; G05B 19/0423; G05B 19/042; G05B 19/0426; G05B 19/058; H02P 3/06; H02H 7/09; H02J 7/0029; H02J 7/007182
USPC ........................................ 702/108
See application file for complete search history.

(56) References Cited

U.S. PATENT DOCUMENTS

| | | | | |
|---|---|---|---|---|
| 5,070,481 A * | 12/1991 | Haubner | ............. | G06F 11/0754 714/E11.005 |
| 5,490,370 A * | 2/1996 | McNair | ................. | A01D 34/78 56/DIG. 15 |
| 2003/0052649 A1* | 3/2003 | Landgraf | ............. | H02J 7/1438 320/135 |
| 2004/0078155 A1* | 4/2004 | Thibedeau | ................ | H02J 7/14 702/63 |
| 2008/0106225 A1* | 5/2008 | Mueller | ................ | H02J 7/0031 361/33 |
| 2012/0309588 A1* | 12/2012 | Ashida | .................. | B60L 3/0007 477/7 |
| 2014/0145652 A1* | 5/2014 | Yamamoto | .............. | B60L 1/003 318/139 |

(Continued)

FOREIGN PATENT DOCUMENTS

| | | | |
|---|---|---|---|
| JP | H07245885 A | * | 9/1995 |
| JP | 3316924 B2 | | 8/2002 |

(Continued)

*Primary Examiner* — Yoshihisa Ishizuka
*Assistant Examiner* — Joshua L Forristall
(74) *Attorney, Agent, or Firm* — POSZ LAW GROUP, PLC (57) ABSTRACT

An actuator control device configured to control an operation of an actuator includes: a detection unit and a restriction unit. The detection unit is configured to monitor a battery voltage and to detect a descent time which is a drop time of the battery voltage from a preset first voltage to a second voltage lower than the first voltage. The restriction unit imposes, when the descent time is equal to or longer than a time threshold, a stronger restriction on an operation of the actuator than an occasion of when the descent time is less than the time threshold.

10 Claims, 7 Drawing Sheets

(56) References Cited

U.S. PATENT DOCUMENTS

| | | | |
|---|---|---|---|
| 2019/0047437 A1* | 2/2019 | Lee | H02J 7/0029 |
| 2019/0263444 A1* | 8/2019 | Yoshikawa | B60Q 9/00 |
| 2019/0307017 A1* | 10/2019 | Kaidu | H02P 29/68 |
| 2021/0103003 A1* | 4/2021 | Sanchez Gonzalez | G01R 31/3835 |
| 2021/0122355 A1* | 4/2021 | Moriya | B60W 10/06 |
| 2022/0140300 A1* | 5/2022 | Yang | H02J 7/00302 320/118 |

FOREIGN PATENT DOCUMENTS

| | | | |
|---|---|---|---|
| KR | 101806705 B1 * | 12/2017 | |
| WO | WO-2021095880 A1 * | 5/2021 | |

* cited by examiner

ACTUATOR CONTROL DEVICE

CROSS REFERENCE TO RELATED APPLICATION

The present application is based on and claims the benefit of priority of Japanese Patent Application No. 2021-100885, filed on Jun. 17, 2021, the disclosure of which is incorporated herein by reference.

TECHNICAL FIELD

The present disclosure generally relates to an actuator control device configured to control the operation of an actuator.

BACKGROUND INFORMATION

A patent document discloses a comparative technique of controlling an actuator by using a correction map in consideration of a voltage drop due to wiring resistance as an actuator control device.

SUMMARY

It is an object of the present disclosure to enable an actuator control device, which is configured to control an operation of an actuator, to suppress abnormal noise generated by the actuator.

DETAILED DESCRIPTION

In the following, an embodiment of the present disclosure will be described with reference to the drawings.

1. First Embodiment

1-1. Configuration

Figure 1:
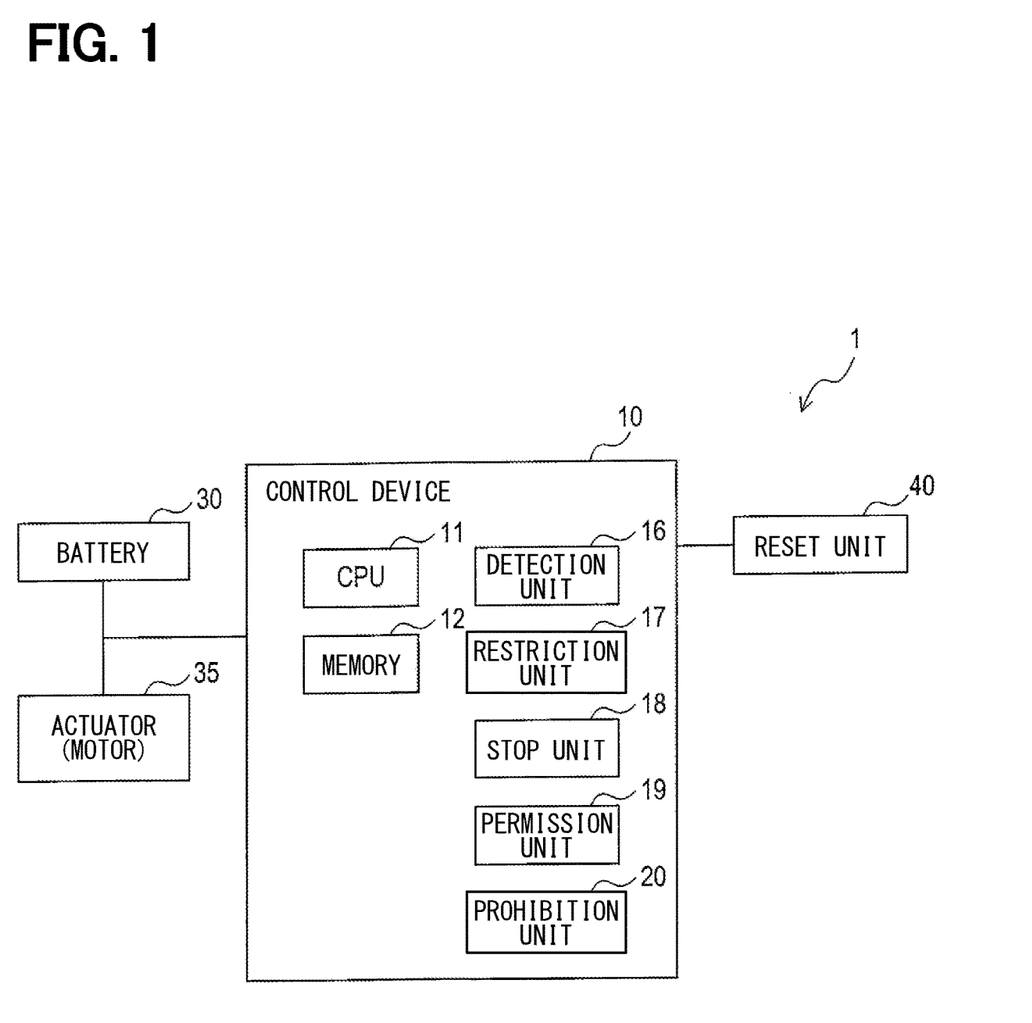
FIG. 1 is a block diagram showing a configuration of a vehicle control system.

A vehicle control system 1 shown in FIG. 1 is a system mounted on a vehicle such as a passenger car and having a function of controlling an actuator 35 in the vehicle. The vehicle control system 1 includes an actuator control device 10. The vehicle control system 1 may include a battery 30, the actuator 35, and a reset unit 40.

The battery 30 is configured as a well-known battery that supplies electric power to electrical components in the vehicle. The battery 30 also supplies electric power to the actuator 35. The voltage of the battery 30 is hereinafter referred to as a battery voltage. More broadly, in this application the term battery voltage is defined broadly to include any voltage provided for powering the actuator. Such a battery voltage may come for example, from a solar array, or from an AC to DC transformer. Such a battery voltage may also be an effective (root-mean-square or RMS) voltage from an AC power supply. Similarly, in this application the term "battery" is defined broadly to include power supplies such as a solar array, or an AC to DC transformer, or an AC power supply.

The actuator 35 is configured as, for example, a motor for blowing air in an air conditioner. The actuator 35 may be other than a motor, and may also be configured as, for example, a valve, a relay switch, or the like. Further, since the operation of the actuator 35 may be temporarily stopped in the present embodiment, the actuator 35 is preferably associated with a motor or the like having little influence on a travel of the vehicle, or on a safety of the vehicle. Further, the term vehicle is defined broadly to include any electrical system.

Note that the reset unit 40 will be described in detail in the third embodiment (step S430 in FIG. 8). The actuator control device 10 includes a CPU 11 and a memory 12. The memory 12 is configured as, for example, a semiconductor memory such as RAM, ROM or the like. The CPU 11 and the memory 12 constitute a microcomputer/microcontroller. The actuator control device 10 is configured to control an operation of the actuator 35.

Each function of the actuator control device 10 is realized by the CPU 11 executing a program stored in a non-transitory, tangible recording medium. In an example of the present embodiment, the memory 12 corresponds to the non-transitory, tangible storage medium storing the program. When the program is executed, a method corresponding to the program is executed. The actuator control device 10 may include one microcomputer/microcontroller or a plurality of microcomputers/microcontrollers. Alternatively, one or more of these functions may be performed by hardware such as logic gates and comparators.

Further, the actuator control device 10 has functions as a detection unit 16 and a restriction unit 17. Further, the actuator control device 10 may have functions as a stop unit 18, a permission unit 19, and a prohibition unit 20. These functions described above will be described later.

1-2. Process

Next, a low voltage protection process performed by the control device 10 will be described with reference to a flowchart of FIG. 2. The low voltage protection process is a process that is repeatedly started at a cycle (for example, 100 ms) that allows measurement of a descent time A (also known as a measured-descent time) regarding a battery voltage drop, which will be described later. Further, the low voltage protection process is a process of detecting a voltage drop due to deterioration of the battery 30 or the like, and restricting the operation of the actuator 35 when the voltage drop is detected.

The present disclosure distinguishes between a (slow) voltage drop due to deterioration of the battery 30 and a (fast) voltage drop due to disturbance such as noise, and in case of voltage drop due to deterioration of the battery 30 or the like, a stronger restriction is imposed than other cases. Note that a stronger restriction may mean either (i) an imposition of restriction when a (slow) voltage drop due to deterioration of the battery 30 or the like is observed, and no restriction is imposed in other cases, (ii) an imposition of restriction in all cases with restriction levels adjusted to each situation, or (iii) restriction release conditions are different in respective cases, with other variations.

In the low voltage protection process, first, in S110, the control device 10 monitors and records a battery voltage. The battery voltage is held/recorded in the memory 12 at least for a time threshold c or more, which will be described later. The time threshold c (also known as a descent-time threshold) is a threshold value used for discriminating/determining whether the battery voltage drop is due to a probably temporary cause (associated with a fast voltage drop, and with a small descent time) or a probably permanent cause (associated with a slow voltage drop, and with a large descent time), and a specific value of the time threshold c is experimentally or theoretically obtained/determined.

Subsequently, in S120, the detection unit 16 of the control device 10 determines whether or not a drop in the battery voltage has been detected. In the process of S120, for example, when the battery voltage detected presently is lower than the battery voltage detected last time, a positive determination is made. When the control device 10 determines that the battery voltage drop has not been detected in S120, the control device 10 ends the low voltage protection process of FIG. 2.

Figure 3:
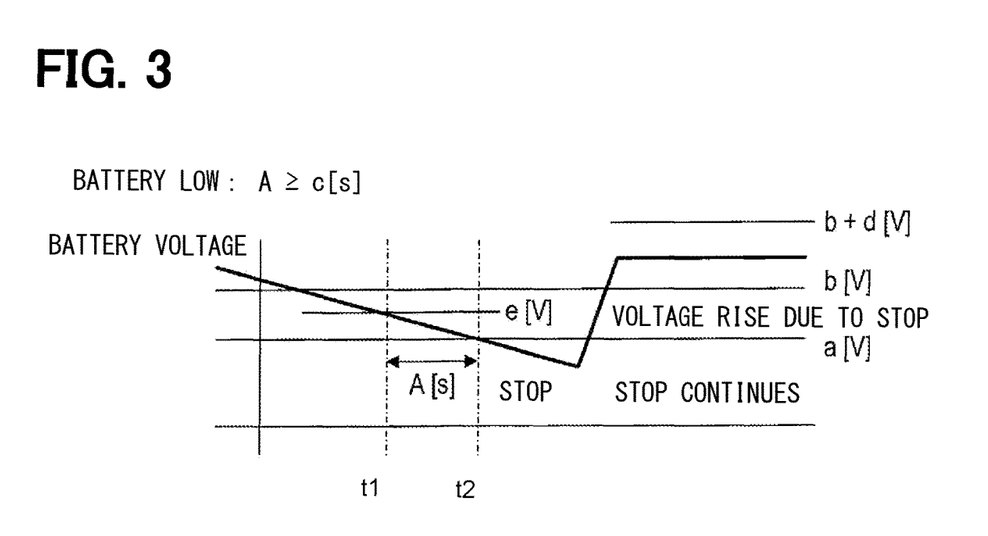
FIG. 3 is a graph showing an operation example when a descent time is equal to or longer than a time threshold in the first embodiment.
Figure 4:
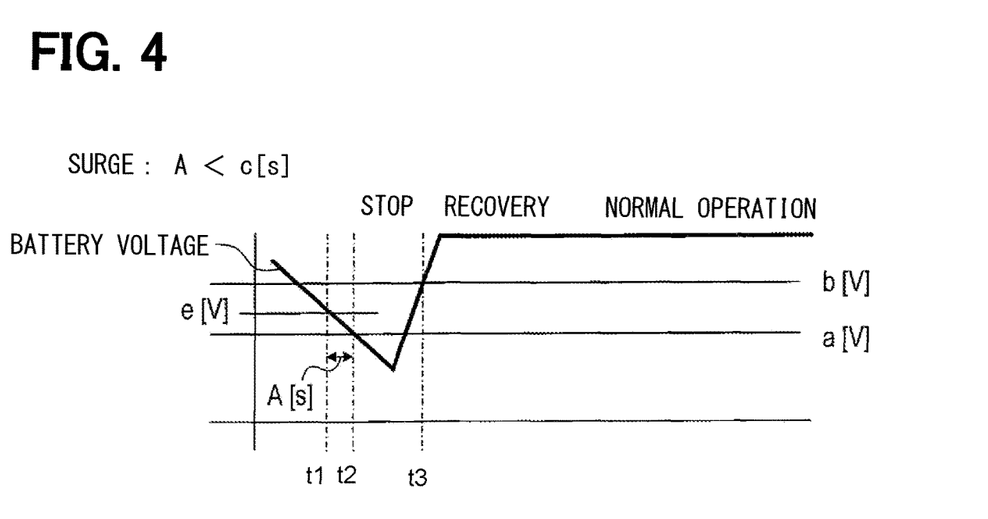
FIG. 4 is a graph showing an operation example when the descent time is less than the time threshold in the first embodiment.

On the other hand, when the control device 10 determines that the battery voltage drop is detected in S120, the control device 10 shifts the process to S130, and determines whether or not the battery voltage is equal to or less than a second voltage a [V]. Here, as shown in FIGS. 3 and 4, regarding the battery voltage, a first voltage is defined as e [V], and the battery voltage used in the determination of S130 is defined as a second voltage a [V]. The second voltage a [V] is set to be less than the first voltage e [V].

Specifically, in FIG. 3, the descent time A [s] is measured beginning when a measured battery voltage drops below the first voltage (e [V]) at time t1 (the left vertical dashed line), and ending when the measured battery voltage drops below the second voltage (a [V]) at time t2 (the right vertical dashed line). Time t1 is known as a start-descent time, and time t2 is known as a stop-descent time. The first voltage e [V] is also known as a start-timing-threshold voltage, and the second voltage a [V] is also known as a stop-timing-threshold voltage.

Return to FIG. 2. When the control device 10 determines in S130 that the battery voltage is higher than the second voltage a [V] (S130=NO), the control device 10 ends the low voltage protection process of FIG. 2. On the other hand, when the control device 10 determines in S130 that the battery voltage is a [V] or less (S130=YES), the control device 10 shifts the process to S140, and the detection unit 16 of the control device 10 determines whether a descent time A is equal to or longer than the descent-time threshold c.

Here, the descent time A represents a time of battery voltage drop (also known as a descent time) from the first voltage e [V] (at the start-descent time t1) to the second voltage a [V] (at the stop descent time t2), as shown in FIGS. 3 and 4. Any method can be adopted as a recognition method of the descent time A.

For example, when the detection unit 16 detects that the battery voltage is the first voltage e [V], the detection unit 16 activates a timer that times out at the time threshold c, and when the second voltage a [V] is reached, if the timer has timed out, it is determined that the descent time A is equal to or longer than the descent-time threshold c. A timer "timing out" occurs when a countdown timer starting at the descent-threshold time counts down to zero.

Alternatively, a regular timer can start counting/timing from zero (at t1, when the first voltage is reached), and can end timing at t2, when the second voltage is reached. Thus, the (measured) descent time A=t2–t1. For example, when the detection unit 16 detects that the battery voltage is the second voltage a [V], the detection unit 16 reads out a time (t1) when the battery voltage in the memory 12 becomes the first voltage e [V]. Then, when a difference between the first time (t1) and the second time (t2) is equal to or greater than the time threshold c, it is determined that the descent time A is equal to or longer than the time threshold c.

In a first case, when the descent time A is short (S140=NO, use a weak restriction), it is highly possible that a temporary voltage fluctuation occurs due to noise or the like from the outside. In a second case, when the descent time A is long (S140=YES, use a strong restriction), it is highly possible that it is in a battery protection situation where the battery 30 should be protected due to insufficient capacity or deterioration of the battery 30. Therefore, in the configuration of the present embodiment, restriction on the operation of the actuator 35 is distinctively set according to the observed descent time A. That is, when the descent time A is equal to or longer than the time threshold c (the second case), a strong restriction is imposed on the operation of the actuator 35.

Consider the second case in more detail (S140=YES, long descent time). Specifically, when the control device 10 determines in S140 that the descent time A is equal to or longer than the descent-time threshold c, the control device 10 shifts the process to S150, and the restriction unit 17 of the control device 10 sets a recovery threshold g as equal to a strong-restriction-threshold voltage (b+d) [V].

The recovery threshold g is a fourth voltage in the present disclosure, and is a battery voltage at which the operation of the actuator 35 is resumed after the operation of the actuator 35 is stopped, as shown in FIGS. 3 and 4. After S150, the process shifts to S170.

Consider the first case in more detail (S140=NO, small descent time). On the other hand, when the control device 10 determines in S140 that the descent time A is less than the time threshold c, the control device 10 shifts the process to S160, and sets the recovery threshold g to a weak-restriction-threshold voltage b [V]. Note that the weak-restriction-threshold voltage b [V] is less than the strong restriction threshold voltage (b+d)_[V], by a difference value of d [V]. Note, the difference value may be fixed, or may be a function of other factors such as battery temperature.

Subsequently, in S170, the stop unit 18 of the control device 10 stops the operation of the actuator 35. Alternatively, step S170 may occur before the logic testing of step S140.

In one embodiment (not shown), the actuator continues operation until the battery voltage becomes equal to or less than a third voltage that is lower than the second voltage a [V]. This embodiment is not shown.

Subsequently, in S180, the permission unit 19 of the control device 10 determines whether or not the battery voltage is equal to or higher than the recovery threshold g. When the permission unit 19 determines in S180 that the battery voltage is not equal to or higher than the recovery threshold g, the permission unit 19 returns the process to S180.

Note that, in case that the process described above repeatedly monitor the battery voltage in S180, the control device 10 is set not to restart the present process. Alternatively, when the present process is restarted, the control device 10 restarts the process (i.e., sequence of the present process) from S180. The same applies to a case where the process of S430 is repeated, which will be described later.

On the other hand, when the permission unit 19 determines in S180 that the battery voltage is equal to or higher than the recovery threshold g, the permission unit 19 shifts the process to S190 and resumes the operation of the actuator 35. Thereafter, the low voltage protection process of FIG. 2 ends. In one embodiment, not shown, after S190 the logic would return to S110 to continue monitoring and recording the battery voltage, such that the low voltage testing process would continue or repeat.

1-3. Operation Example, FIG. 3

An operation example in the present embodiment will be described.

Figure 2:
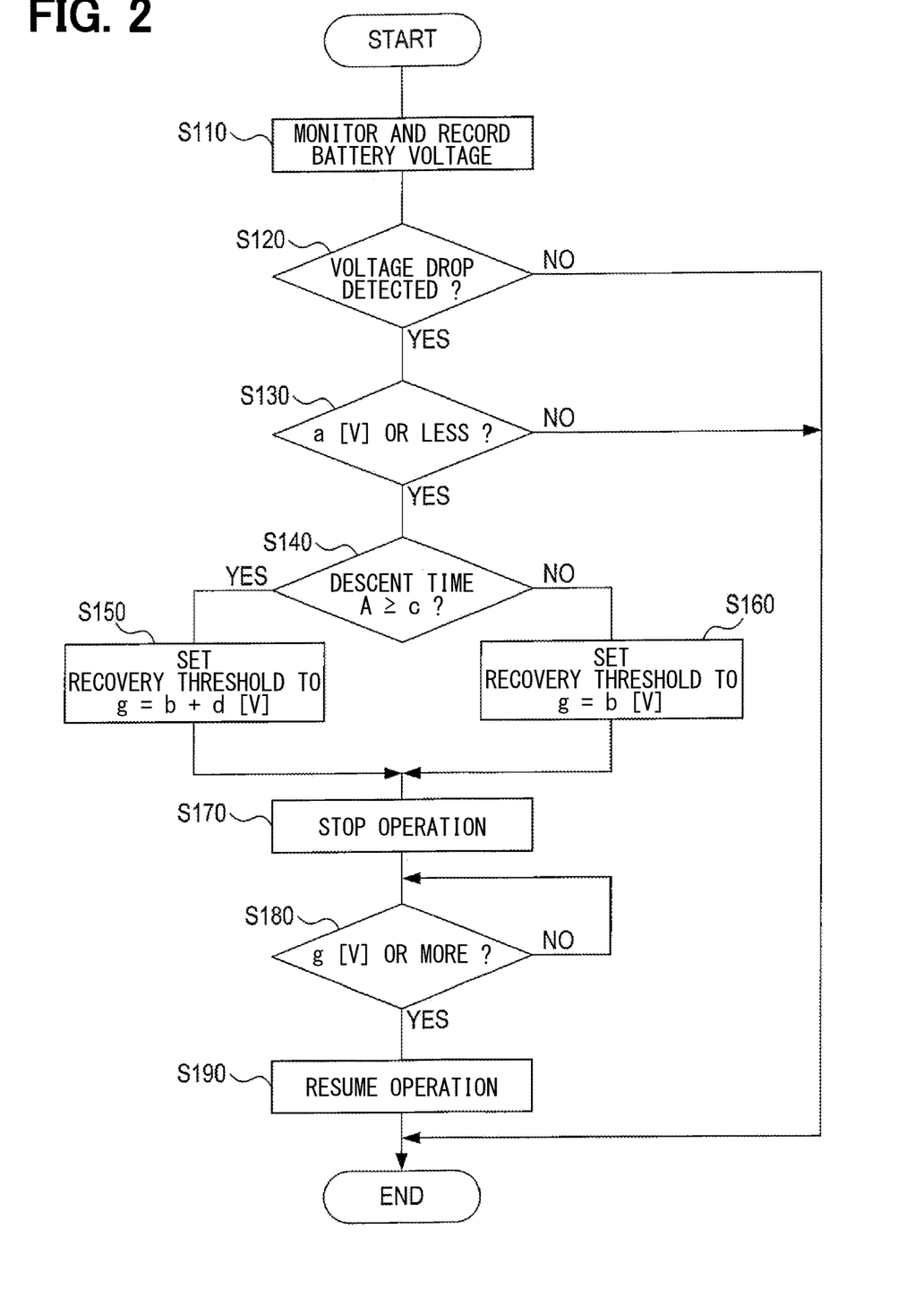
FIG. 2 is a flowchart of a low voltage protection process according to a first embodiment.

Begin with the strong restriction case (S140=YES in FIG. 2). When the descent time A is equal to or longer than the time threshold c, such as in the case of battery deterioration, the battery voltage gradually decreases from the first voltage e [V] to the second voltage a [V] as shown in FIG. 3. Thereafter, the actuator 35 is stopped (S170 in FIG. 2), and even when the battery voltage rises to b [V], if the battery voltage is less than the strong restriction threshold voltage (b+d) [V], which is the recovery threshold after S150, then stop of the actuator 35 continues as shown in FIG. 3.

Note, in this strong restriction case, that the actuator 35 operates (resumes operation) when the battery voltage becomes equal to or higher than (b+d) [V], which is the recovery threshold g after the change, such as when the battery 30 is sufficiently charged. This recovery in the strong restriction case is NOT SHOWN in FIG. 3, but corresponds to S180=YES when the recovery-threshold voltage g [V] is set to the strong-restriction-threshold voltage (b+d) [V] in S150.

Now consider the weak restriction case (S140=NO in S140). When the descent time A is less than the time threshold c, such as when affected by noise, the battery voltage drops from the first voltage e [V] to the second voltage a [V] as shown in FIG. 4 in a relatively short time (S140=NO). In this weak restriction case, at S160 the recovery-threshold voltage g [V] is set to the weak-restriction-threshold voltage b [V] in S160. At S170, the actuator 35 is also stopped. However, when the battery voltage rises to or above b [V], which is the recovery threshold g for the weak restriction case, the actuator 35 operates normally (i.e., resumes operation at S190). Such resumption is shown at t3 in FIG. 4.

In FIGS. 3 and 4, t1 is a start-descent time, t2 is a stop descent time, and t3 is a recovery time when S180=YES.

1-4. Effects

The present embodiment achieves the following effects.

(1a) One aspect of the present disclosure is an actuator control device 10 configured to control the operation of the actuator 35. The actuator control device 10 includes a detection unit 16 and a restriction unit 17.

The detection unit 16 is configured to monitor the battery voltage and to detect a descent time A, which represents the time for the battery voltage to drop from the preset first voltage e [V] to the second voltage a [V] lower than the first voltage. The restriction unit 17 is configured to impose a stronger restriction on the operation of the actuator 35 when the descent time A is equal to or longer than the preset time threshold c than an occasion of when the descent time A is less than the time threshold c (also known as a descent-time threshold).

According to such a configuration, it is possible to easily suppress abnormal noise generated when the operation state of the actuator 35 changes. It should be noted that the abnormal noise may be generated by hunting of the motor, or may be generated from the components constituting a valve, a relay, etc., but according to the configuration of the present embodiment, these abnormal noises can all be suppressed. Further, since the voltage drop of the battery 30 can be suppressed thereafter, other devices connected to the battery 30 and the battery 30 itself can be protected.

(1b) One aspect of the present disclosure further comprises a stop unit 18 and a permission unit 19. The stop unit 18 is configured to stop the operation of the actuator 35 when the battery voltage becomes the third voltage or less, which is set to the second voltage a [V] or less. The permission unit 19 is configured to permit the operation of the actuator 35 when the battery voltage becomes the recovery threshold g or more, which is set to be higher than the second voltage a [V].

According to such a configuration, the operation of the actuator 35 is stopped when the battery voltage becomes the third voltage or less, and the operation of the actuator 35 is permitted when the battery voltage becomes the recovery threshold g or more. Therefore, a load on the battery 30 is suppressible until the battery voltage rises to or above the recovery threshold g.

(1c) In one aspect of the present disclosure, when the descent time A is equal to or longer than the time threshold c, the restriction unit 17 sets a fourth voltage b [V] to a greater value b+d [V], as compared with an occasion of when the descent time A is less than the time threshold c.

According to such a configuration, when the descent time A is equal to or longer than the time threshold c, the actuator 35 is set to be difficult to operate, so that the load of the battery 30 can be further suppressed.

2. Second Embodiment, FIGS. 5-7

2-1. Difference from First Embodiment

The fundamental configuration of the second embodiment is similar to that of the first embodiment. Therefore, the difference therebetween will be described in the following. The same reference numerals as in the first embodiment denote the same components, and reference is made to the preceding description.

In the low voltage protection process of the first embodiment described above, depending on whether or not the descent time A is equal to or longer than the time threshold c, the recovery threshold g is distinctively set (i.e., is set to different values). On the other hand, in the second embodiment, the rate of change in the motor rotation speed (hereinafter, also referred to as RAMP) is limited/controlled depending on whether or not the descent time A is equal to or longer than the time threshold c, which is a difference from the first embodiment. The actuator 35 of the present embodiment is configured as a motor.

Specifically, in the second embodiment the strong restriction case sets an actuator control setting to a fixed ramp, such that changes in the actuator motor speed occur at a low rate. This low rate is a (relatively low) fixed ramp value f measured in rpm/s {(revolutions/minute)/second)} or similar.

In contrast, in the second embodiment the weak restriction case sets the actuator control setting to "normal" ramp setting (also known as an instruction ramp setting), such that the actuator may ramp variably according to an instruction value. The instruction ramp value may exceed the fixed ramp value f.

2-2 Process for Second Embodiment

Figure 5:
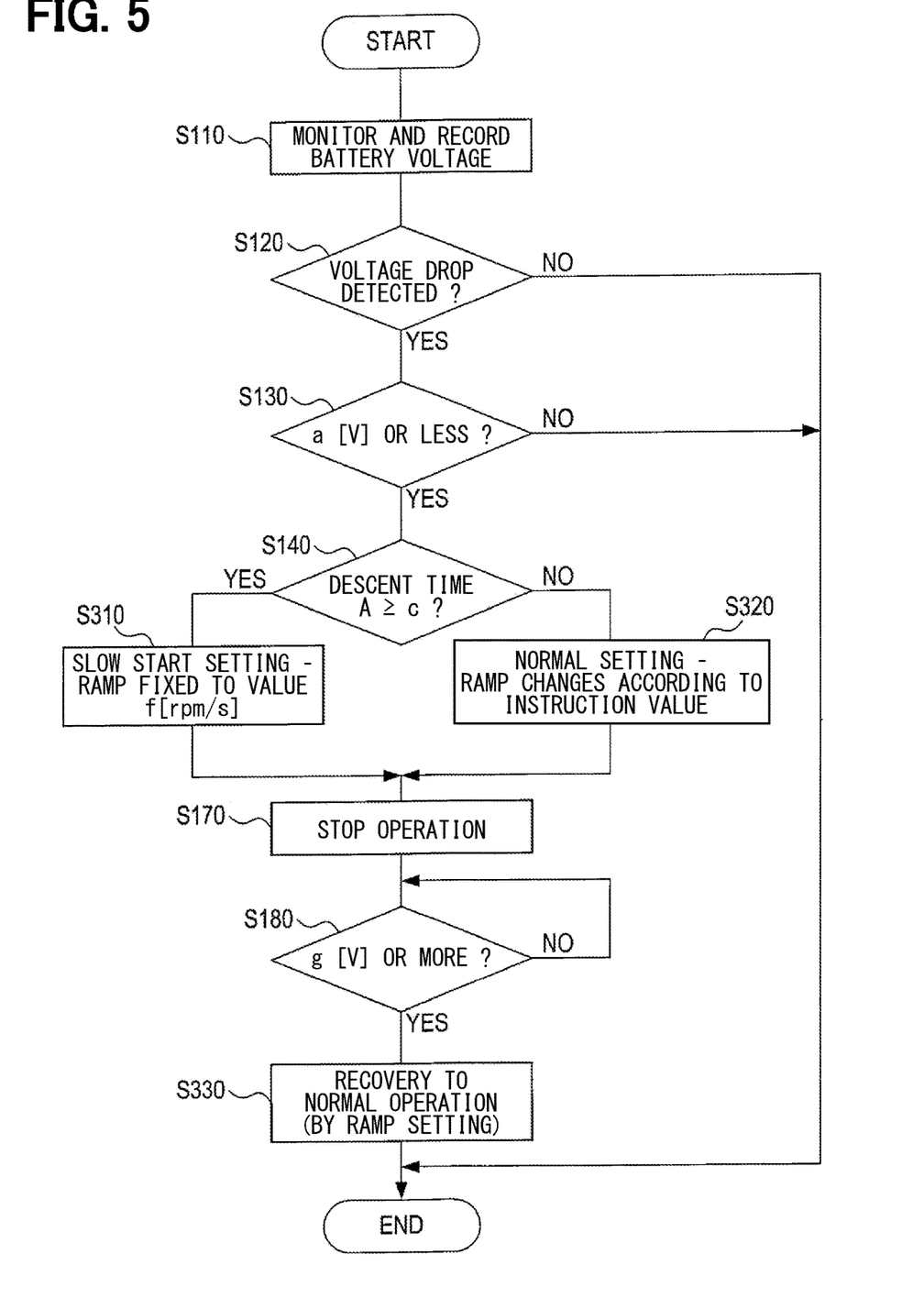
FIG. 5 is a flowchart of a low voltage protection process in a second embodiment.

Next, in the low voltage protection process of the second embodiment, as shown in FIG. 5, the same process as the low voltage protection process of the first embodiment is carried out in S110 to S140.

Consider the strong restriction case of the second embodiment. Then, when the detection unit 16 of the control device 10 determines in S140 that the descent time A is equal to or longer than the time threshold c, the detection unit 16 shifts the process to S310, and the restriction unit 17 of the control device 10 sets a slow start (also known as fixed ramp). Slow start means that RAMP is fixedly set to f [rpm/s]. That is, the rate of change in the motor rotation speed is limited so that the motor rotation speed does not increase significantly in a short time. Thereafter, the present process shifts to S170. Note, this slow start restriction reduces the current spike and the amperage spike often caused by an actuator motor during start up.

Now consider the weak restriction case for the second embodiment. When the control device 10 determines in S140 that the descent time A is less than the time threshold c, the control device 10 shifts the process to S320 and sets a normal setting. In the normal setting, the RAMP is allowed to be greater than f [rpm/s], and the motor rotation speed is set to change/fluctuate according to a RAMP instruction value. Thereafter, the present process shifts to S170.

Subsequently, in S170 and S180, the same process as the low voltage protection process of the first embodiment is carried out. When the permission unit 19 of the control device 10 determines in S180 that the battery voltage is equal to or higher than the recovery threshold g, the permission unit 19 shifts the process to S330 and the operation of the actuator 35 is recovered. Note that the motor rotation speed after the recovery follows the RAMP setting. Thereafter, the low voltage protection process of FIG. 5 ends.

Figure 6:
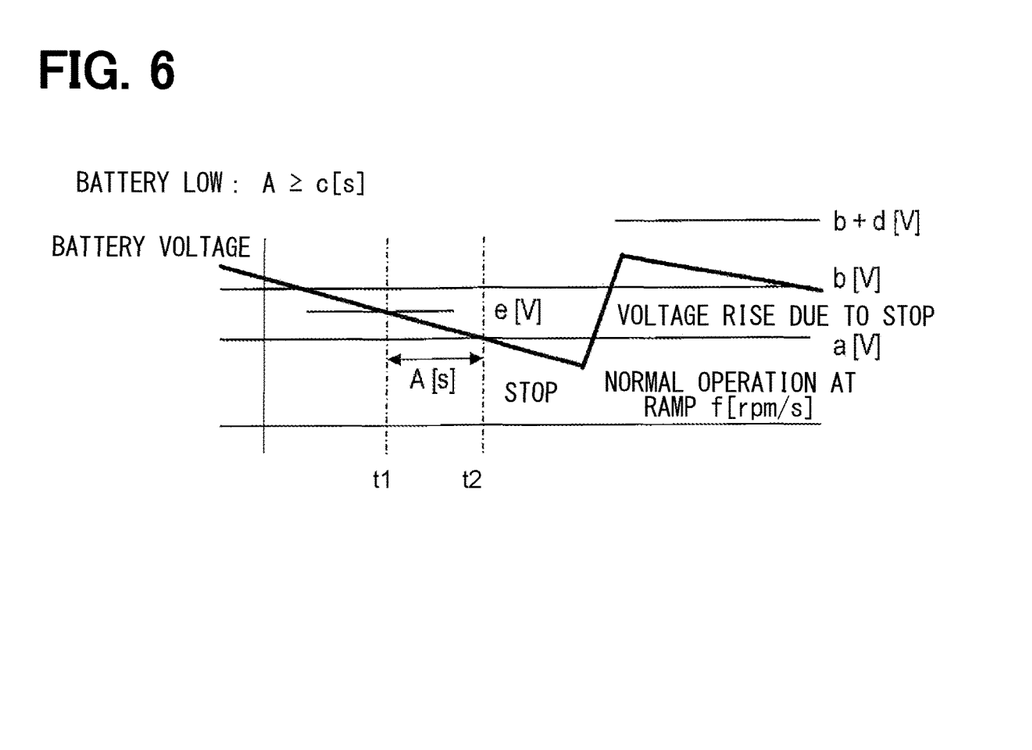
FIG. 6 is a graph showing an operation example when the descent time is equal to or longer than the time threshold in the second embodiment.
Figure 7:
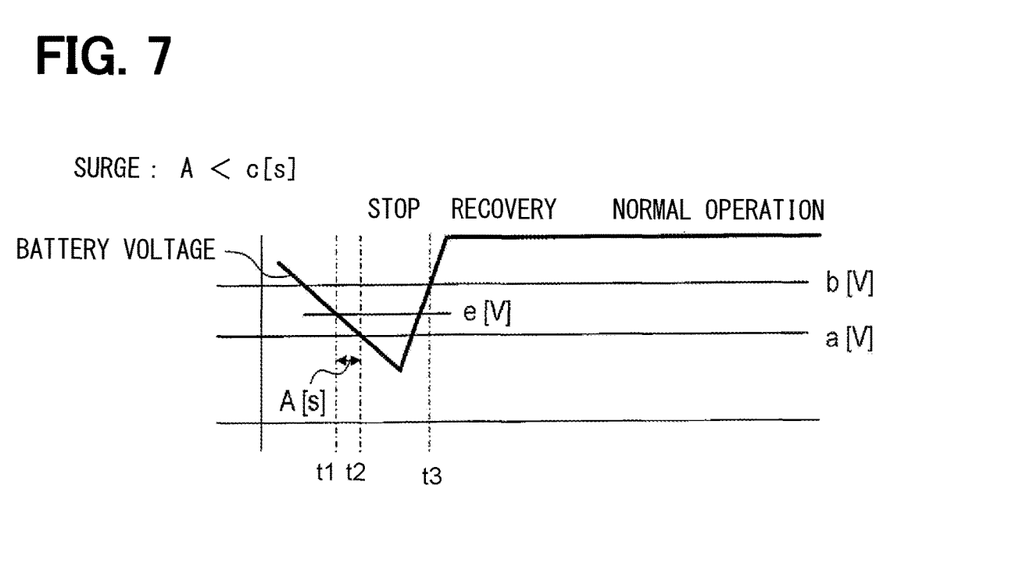
FIG. 7 is a graph showing an operation example when the descent time is less than the time threshold in the second embodiment.

Note, in FIGS. 6 and 7 g [V] is shown as the recovery-threshold voltage, and has the same value in both figures. This value may or may not equal b [V], or to (b+d) [V] in FIGS. 3 and 4 of the first embodiment.

2-3. Operation Example

An operation example in the present embodiment will be described. Consider the strong restriction case. In case of battery deterioration or the like, if the descent time A is equal to or longer than the time threshold c, the battery voltage gradually lowers from the first voltage e [V] to the second voltage a [V], as shown in FIG. 6. Thereafter, the actuator 35 is stopped, and when the battery voltage rises g [V], the actuator 35 operates. However, in such case, since the RAMP is fixedly set to f [rpm/s], the power consumption by the actuator 35 is suppressed during start-up or recovery or resumption. Therefore, it takes a long time for the battery voltage to drop to the first voltage e [V] again. Thus, the number of times the motor is stopped can be reduced, and the motor rotation speed can be configured so as not to fluctuate significantly in a short time. Therefore, it is possible to suppress abnormal noise generated when the motor rotation speed changes.

Now consider the weak restriction case. When the descent time A is less than the time threshold c, such as under an influence of the noise, the battery voltage changes from the first voltage e [V] to the second voltage a [V] as shown in FIG. 7, i.e., drops in a relatively short time. In such case, the actuator 35 is also stopped. However, when the battery voltage becomes equal to or higher than the recovery threshold value g [V], the actuator 35 operates according to a normal RAMP setting, also known as an instruction RAMP setting.

As discussed above, in the second embodiment the weak restriction case sets the actuator control setting to a "normal" ramp setting (also known as an instruction ramp setting), such that the actuator may ramp variably according to an instruction value. The instruction ramp value may exceed the fixed ramp value f.

2-4. Effects

The second embodiment described above provides the effect (1a) according to the above described first embodiment and also the following effects.

(2a) In one aspect of the present disclosure, the actuator 35 is configured as a motor. Consider the strong restriction case of the second embodiment, with a small modification of S310. When the descent time A is equal to or longer than the time threshold c, the restriction unit 17 sets an upper restriction value for the rate of change in the motor rotation speed. This may be described as "limited variable setting". Thus, the ramp changes according to the instruction value when the instruction value is small. However, the ramp is fixed at a safety value when the instruction value exceeds the safety value. This modification is not shown.

According to the second embodiment (and to the small modification of the second embodiment), since the motor rotation speed can be configured so as not to suddenly fluctuate, it is possible to suppress abnormal noise generated when the motor rotation speed changes. Further, according to such a configuration, it is possible to realize a countermeasure against abnormal noise without changing the recovery threshold g.

3. Third Embodiment, FIGS. 8-10

3-1. Differences from the Above Embodiment(s)

The low voltage protection process of the third embodiment is different from the above embodiments in that the operation of the stopped actuator 35 is not in some cases permitted. Specifically, in the strong restriction case, operation is prohibited (S410) and stopped (S420) until a reset signal is received (S430=YES).

Here, the reset unit 40 shown in FIG. 1 has a function of transmitting a reset signal to the actuator control device 10.

The reset unit 40 is configured as, for example, an IC that is capable of detecting a battery voltage. In such case, when the battery voltage becomes lower than a set voltage (for example, 5V) set to be lower than the second voltage a [V], the reset unit 40 records the battery voltage drop inside itself. In another embodiment, the reset may be a "manual" reset from a user interacting with the vehicle control system 1. Or the reset signal may be sent when other conditions are satisfied.

With such configuration, the reset unit 40 can detect that the battery has been (temporarily) removed due to battery replacement or the like. Thereafter, the reset unit 40 sends a reset signal to the control device 10 when the control device 10 is operating normally due to recovery of the battery voltage to about a fourth voltage b [V], or the like. A reset signal may be a signal indicating that the battery 30 may have been replaced.

3-2. Process

Figure 8:
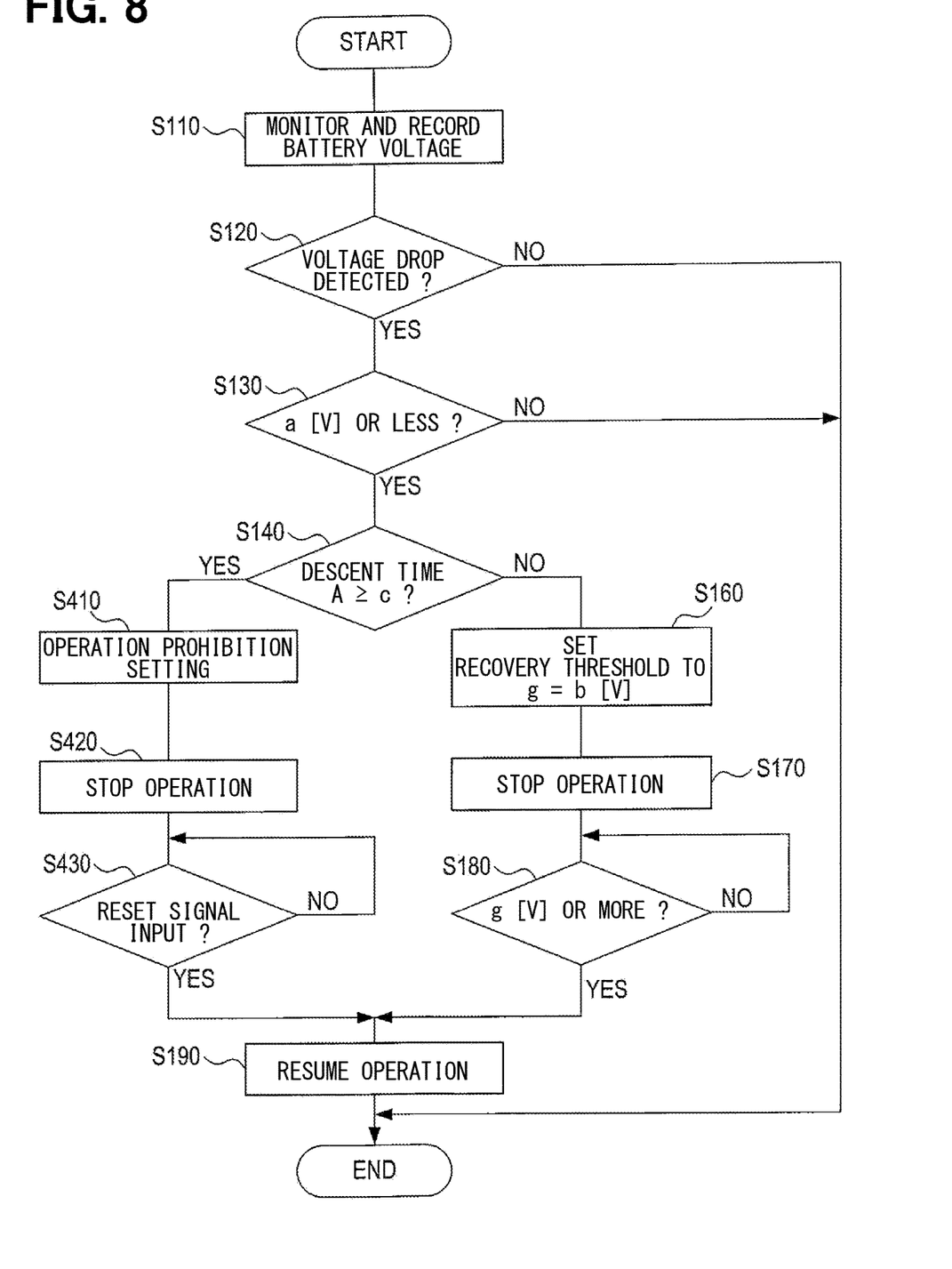
FIG. 8 is a flowchart of a low voltage protection process in a third embodiment.

Next, in the low voltage protection process of the third embodiment, as shown in FIG. 8, the same process as the low voltage protection process of the first embodiment is carried out in S110 to S140.

Consider the strong restriction case for the third embodiment. When the control device 10 determines in S140 that the descent time A is equal to or longer than the time threshold c, the control device 10 shifts the process to S410, and the prohibition unit 20 of the control device 10 sets prohibition of the operation of the actuator 35.

Subsequently, in S420, the stop unit 18 of the control device 10 stops the operation of the actuator 35. Subsequently, in S430, the permission unit 19 of the control device 10 determines whether or not a reset signal has been input (received).

When the permission unit 19 determines in S430 that any reset signal has not been input, the prohibition unit 20 continues to stop the operation of the actuator 35 and returns the process to S430. On the other hand, when the permission unit 19 determines that a reset signal has been input in S430, the permission unit 19 shifts the process to S190 and resumes the operation of the actuator 35.

3-3. Operation Example

Figure 9:
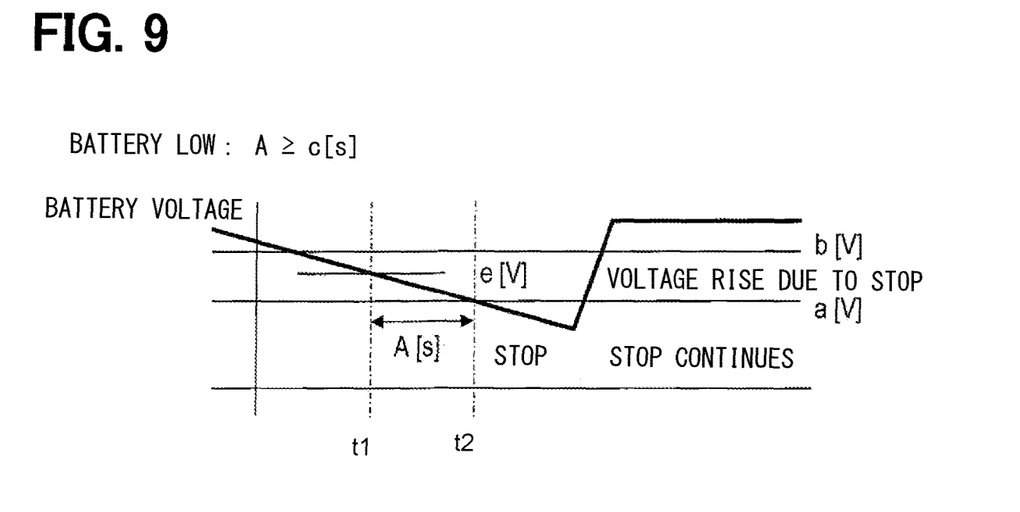
FIG. 9 is a graph showing an operation example when the descent time is equal to or longer than the time threshold in the third embodiment.

An operation example in the present embodiment will be described. Consider the strong restriction case. In case of battery deterioration or the like, when the descent time A is equal to or longer than the time threshold c, the battery voltage gradually lowers from the first voltage e [V] to the second voltage a [V] as shown in FIG. 9. Thereafter, the actuator 35 is stopped, and even when the battery voltage rises back to b [V], when any reset signal has not been received, the actuator 35 continues to be stopped. Note that when a reset signal has been received due to the replacement of the battery 30 or the like, the actuator 35 operates when the battery voltage becomes equal to or higher than the recovery threshold g (b [V]).

Figure 10:
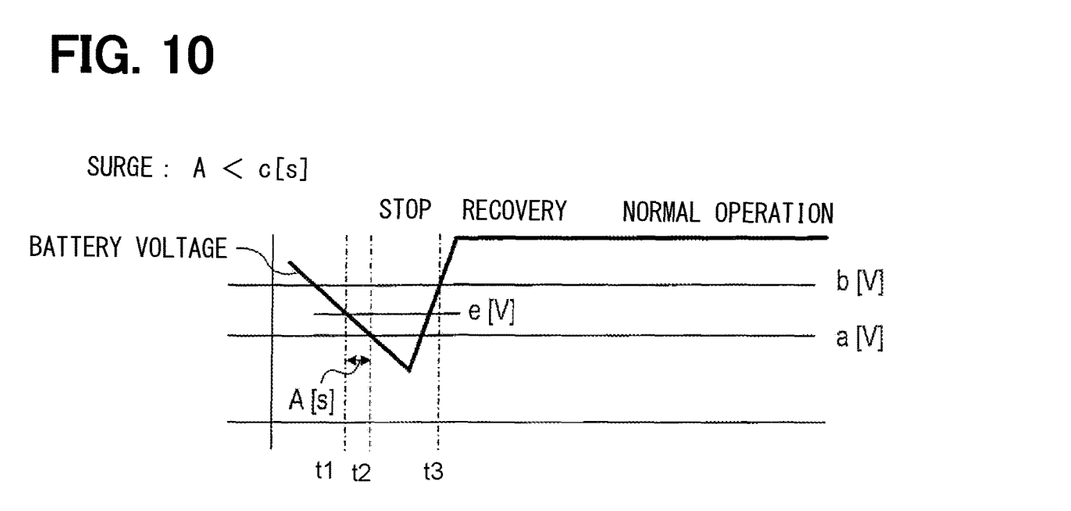
FIG. 10 is a graph showing an operation example when the descent time is less than the time threshold in the third embodiment.

On the other hand, when the descent time A is less than the time threshold c, such as when affected by noise, the battery voltage changes from the first voltage e [V] to the second voltage a [V] as shown in FIG. It drops in a relatively short time. In such case, the actuator 35 is also stopped. However, when the battery voltage rises, the actuator 35 operates when the battery voltage becomes equal to or higher than the recovery threshold g (b [V]).

Note, in the weak restriction case of the third embodiment, it might not be necessary to set the recovery threshold g. This recovery threshold might be fixed. Thus, step S160 may be removed in some embodiments. In other words, step S160 is optional in the third embodiment.

3-4. Effects

According to the third embodiment described in detail above, the effect (1a) of the above-mentioned first embodiment is achieved, and the following effects are further achievable.

(3a) In one aspect of the present disclosure, the prohibition unit 20 is further provided. The prohibition unit 20 is configured to prohibit the operation of the actuator 35 even when the battery voltage rises from the third voltage to the fourth voltage when the descent time A is equal to or longer than the time threshold c. With such a configuration, the setting will not be changed according to various conditions such as the length of the wiring to the actuator 35 or the like. Therefore, the function of protection processing can be realized with a simple configuration/design.

(3b) In one aspect of the present disclosure, the prohibition unit 20 stops a function of prohibiting the operation of the actuator 35 when a reset signal is input (for example, when it is recognized that a device such as an IC has been reset).

With such a configuration, the actuator 35 can be configured to be operable (i.e., can resume its operation) when a reset signal is input.

4. Other Embodiments

Although the present disclosure has been described with reference to embodiments thereof, it is to be understood that the present disclosure is not limited to the embodiments and constructions, and encompasses various modifications and equivalent arrangements.

(4a) In the above embodiments, the operation of the actuator 35 is limited according to the descent time A, but the present disclosure is not limited thereto. For example, the present disclosure may provide a battery state determination device which is configured to determine whether a situation is (a) that the battery 30 is deteriorated or insufficiently charged, or (b) is merely a noise, depending on the descent time A regardless of the presence or absence of the actuator 35.

(4b) The actuator control device 10 and a method thereof described in the present disclosure may be realized as a dedicated computer that is provided by configuring a processor and memory programmed to perform one or more functions embodied by a computer program. Alternatively, the actuator control device 10 and its method described in the present disclosure may be realized by a dedicated computer provided by configuring a processor with one or more dedicated hardware logic circuits. Alternatively, the actuator control device 10 and its method described in the present disclosure may be realized by one or more dedicated computers respectively configured as a combination of (i) a processor and memory programmed to perform one or more functions and (ii) a processor configured by one or more hardware logic circuits. Further, the computer program may be stored in a computer-readable, non-transitory, tangible recording medium as an instruction to be executed by the computer. The method for realizing the functions of each part included in the actuator control device 10 does not necessarily include software, and all the functions may be realized by using one or more hardware devices.

(4c) A plurality of functions possessed by one component in the above embodiment may be realized by a plurality of components, or one function possessed by one component may be realized by a plurality of components. Further, multiple functions of multiple components may be implemented by one component, or one function implemented by multiple components may be implemented by one component. In addition, a part of the configuration of the above embodiment may be omitted. Further, at least part of the configuration of the above-described embodiment may be added to or replaced with the configuration of another embodiment described above.

(4d) In addition to the actuator control device 10 described above, the present disclosure may also be realized is various forms, such as (i) a system having the actuator control device 10 as a component, (ii) a program for operating a computer as the actuator control device 10, (iii) a non-transitory, tangible recording medium of recording the program such as a semiconductor memory or the like, a method of controlling an actuator, together with other forms.

TABLE 1

DESCRIPTIVE NAMES FOR REFERENCE CHARACTERS

| REF. CHAR. | DESCRIPTIVE NAME | OTHER NAME |
|---|---|---|
| e [V] | start-descent-threshold voltage | first voltage |
| a [V] | stop-descent-threshold voltage | second voltage |
| b [V] | weak-restriction-threshold voltage | |
| d [V] | restriction-difference voltage | |
| (b + d) [V] | strong-restriction-threshold voltage | fourth voltage |
| g [V] | recovery-threshold voltage | recovery threshold |
| t1 | start-descent time | |
| t2 | stop-descent time | |
| t3 | start-recovery time | |
| A [s] | descent time (= t2 − t1) | |
| c [s] | descent-time threshold | preset time threshold |
| f [rmp/s] | fixed-ramp value (or restricted-ramp value) | |

What is claimed is:

1. An actuator control device configured to control an operation of an actuator, the actuator control device comprising:
at least one processor, configured to
monitor a battery voltage and detect a descent time representing a time of drop of a battery voltage from a first voltage to a second voltage that is lower than the first voltage;
impose a strong restriction on an operation of the actuator when the descent time is equal to or longer than a time threshold, and impose a weak restriction when the descent time is less than the time threshold;
stop the operation of the actuator when the battery voltage is equal to or less than a third voltage that is set to be equal to or less than the second voltage; and
permit the operation of the actuator when the battery voltage is equal to or higher than a fourth voltage that is set to be higher than the second voltage, and
set, when the descent time is less than the time threshold, the fourth voltage to a higher value than an occasion of when the descent time is equal to or longer than the time threshold.

2. The actuator control device according to claim 1, wherein
the actuator is configured as a motor, and
the at least one processor is configured to set an upper restriction value for a rate of change in a motor rotation speed when the descent time is equal to or longer than the time threshold value.

3. The actuator control device according to claim 1, wherein the at least one processor is configured to
prohibit, when the descent time is equal to or longer than the time threshold, the operation of the actuator until after a reset signal is received.

4. The actuator control device according to claim 3, wherein the at least one processor is configured to
stop a function of prohibiting the operation of the actuator when a reset signal is received.

5. An actuator control device comprising:
at least one processor; and
a non-transitory computer-readable storage medium storing instructions,
wherein the actuator control device is configured to control an actuator by performing the following steps:
(i) monitor a battery voltage,
(ii) determine a descent time from a first voltage to a second voltage,
(iii) determine whether the descent time is greater than or equal to a descent-time threshold,
(iv) perform, upon a determination that the descent time is greater than or equal to the descent-time threshold, a strong-restriction process,
(iv) perform, upon a determination that the descent time is less than the descent-time threshold, a weak-restriction process,
(v) stop the operation of the actuator when the battery voltage is equal to or less than a third voltage that is set to be equal to or less than the second voltage; and
(vi) permit the operation of the actuator when the battery voltage is equal to or higher than a fourth voltage that is set to be higher than the second voltage, and
(vii) set, when the descent time is less than the time threshold, the fourth voltage to a higher value than an occasion of when the descent time is equal to or longer than the time threshold.

6. The actuator control device of claim 5, wherein the weak restriction process is one of the following processes:
a small-recovery-threshold voltage process that:
(i) sets a recovery-threshold voltage to a weak-restriction-threshold voltage, or uses a default recovery-threshold value,
(ii) stops operating the actuator, and
(iii) resumes operating the actuator after the battery voltage exceeds the recovery-threshold voltage; and
a normal-start process that:
(i) permits ramp changes according to an instruction value,
(ii) stops operating the actuator, and
(iii) resumes operating the actuator after the battery voltage exceeds a recovery-threshold voltage, such that normal ramp changes are permitted.

7. The actuator control device of claim 5,
wherein the strong-restriction process is a large-recovery-threshold voltage process, that:
(i) sets a recovery-threshold voltage to a strong-restriction-threshold voltage,
(ii) stops operating the actuator, and
(iii) resumes operating the actuator after the battery voltage exceeds the recovery threshold voltage, and wherein the weak-restriction process is a small-recovery-threshold voltage process that:
   (i) sets the recovery-threshold voltage to a weak-restriction-threshold voltage, or uses a default recovery-threshold value,
   (ii) stops operating the actuator, and
   (iii) resumes operating the actuator after the battery voltage exceeds the recovery-threshold voltage.

8. The actuator control device of claim 5,
wherein the strong restriction process is a slow-start process,
wherein the slow-start process:
   (i) sets ramp changes to a fixed value,
   (ii) stops operating the actuator, and
   (iii) resumes operating the actuator after the battery voltage exceeds a recovery-threshold voltage such that ramp changes are fixed;
wherein the weak-restriction process is a normal start process that:
   (i) permits ramp changes according to an instruction value,
   (ii) stops operating the actuator, and
   (iii) resumes operating the actuator after the battery voltage exceeds a recovery-threshold voltage, such that normal ramp changes are permitted.

9. The actuator control device of claim 5,
wherein the strong-restriction process is an operation-prohibition process that:
   (i) prohibits operating the actuator, and then
   (ii) stops operating the actuator until a reset signal is received, and
wherein the weak-restriction process is a small recovery-threshold voltage process that:
   (i) sets a recovery-threshold voltage to a weak-restriction-threshold voltage,
   (ii) stops operating the actuator, and
   (iii) resumes operating the actuator after the battery voltage exceeds the recovery-threshold voltage.

10. The actuator control device of claim 5, wherein the strong-restriction process includes at least one of the following processes:
   a large-recovery-threshold voltage process, that:
     (i) sets a recovery-threshold voltage to a strong-restriction-threshold voltage,
     (ii) stops operating the actuator, and
     (iii) resumes operating the actuator after the battery voltage exceeds the recovery-threshold voltage;
   a slow-start process that:
     (i) sets ramp changes to a fixed value,
     (ii) stops operating the actuator, and
     (iii) resumes operating the actuator after the battery voltage exceeds a recovery-threshold voltage such that ramp changes are fixed; and
   an operation-prohibition process that:
     (i) prohibits operating the actuator, and then
     (ii) stops operating the actuator until a reset signal is received.

\* \* \* \* \*